(12) United States Patent
Lin et al.

(10) Patent No.: US 11,723,287 B2
(45) Date of Patent: Aug. 8, 2023

(54) METHOD OF MANUFACTURING MAGNETIC TUNNEL JUNCTION (MTJ) DEVICE

(71) Applicant: UNITED MICROELECTRONICS CORP., Hsin-Chu (TW)

(72) Inventors: Da-Jun Lin, Kaohsiung (TW); Shih-Wei Su, Tainan (TW); Bin-Siang Tsai, Changhua County (TW); Ting-An Chien, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/956,772

(22) Filed: Sep. 29, 2022

(65) Prior Publication Data
US 2023/0017965 A1  Jan. 19, 2023

Related U.S. Application Data

(62) Division of application No. 16/916,037, filed on Jun. 29, 2020, now Pat. No. 11,495,737.

(51) Int. Cl.
| | |
|---|---|
| *H01L 27/22* | (2006.01) |
| *H01L 43/02* | (2006.01) |
| *H01L 43/08* | (2006.01) |
| *H01L 43/10* | (2006.01) |
| *H01L 43/12* | (2006.01) |
| *H10N 50/80* | (2023.01) |
| *H10B 61/00* | (2023.01) |
| *H10N 50/01* | (2023.01) |
| *H10N 50/85* | (2023.01) |

(52) U.S. Cl.
CPC ............. *H10N 50/80* (2023.02); *H10B 61/00* (2023.02); *H10N 50/01* (2023.02); *H10N 50/85* (2023.02)

(58) Field of Classification Search
CPC ......... H01L 43/02; H01L 43/08; H01L 43/10; H01L 43/12; H01L 27/222; H10N 50/80; H10N 50/01; H10N 50/85; H10N 61/00
See application file for complete search history.

(56) References Cited

U.S. PATENT DOCUMENTS 10,134,981 B1 * 11/2018 Yang ................... H01L 43/02
10,468,585 B1 * 11/2019 Nguyen ............... H01L 27/222
(Continued)

FOREIGN PATENT DOCUMENTS

JP    2008-181971    8/2008

*Primary Examiner* — Omar F Mojaddedi
(74) *Attorney, Agent, or Firm* — Winston Hsu

(57) ABSTRACT

A magnetic tunnel junction (MTJ) device includes a bottom electrode, a reference layer, a tunnel barrier layer, a free layer and a top electrode. The bottom electrode and the top electrode are facing each other. The reference layer, the tunnel barrier layer and the free layer are stacked from the bottom electrode to the top electrode, wherein the free layer includes a first ferromagnetic layer, a spacer and a second ferromagnetic layer, wherein the spacer is sandwiched by the first ferromagnetic layer and the second ferromagnetic layer, wherein the spacer includes oxidized spacer sidewall parts, the first ferromagnetic layer includes first oxidized sidewall parts, and the second ferromagnetic layer includes second oxidized sidewall parts. The present invention also provides a method of manufacturing a magnetic tunnel junction (MTJ) device.

19 Claims, 6 Drawing Sheets

(56) References Cited

U.S. PATENT DOCUMENTS

| | | | |
|---|---|---|---|
| 2003/0231437 A1* | 12/2003 | Childress | H01L 43/12 29/603.18 |
| 2009/0256220 A1* | 10/2009 | Horng | H10N 50/01 257/E29.323 |
| 2012/0128870 A1* | 5/2012 | Zhao | H01L 43/12 427/130 |
| 2013/0175644 A1* | 7/2013 | Horng | H10N 50/01 257/E29.323 |
| 2014/0210021 A1* | 7/2014 | Zhu | H10N 50/80 156/345.1 |
| 2019/0051822 A1 | 2/2019 | Chatterjee | |
| 2019/0067367 A1 | 2/2019 | Sejima | |
| 2019/0109277 A1* | 4/2019 | Jan | H10N 50/85 |

* cited by examiner

METHOD OF MANUFACTURING MAGNETIC TUNNEL JUNCTION (MTJ) DEVICE

CROSS REFERENCE TO RELATED APPLICATIONS

This application is a division of U.S. application Ser. No. 16/916,037, filed on Jun. 29, 2020. The content of the application is incorporated herein by reference.

BACKGROUND OF THE INVENTION

1. Field of the Invention

The present invention relates generally to a magnetic tunnel junction (MTJ) device and manufacturing method thereof, and more specifically to a magnetic tunnel junction (MTJ) device inserting a spacer and manufacturing method thereof.

2. Description of the Prior Art

Magnetoresistive random access memory (MRAM) is a type of memory device containing an array of MRAM cells that store data using resistance values instead of electronic charges. Each MRAM cell includes a magnetic tunnel junction (MTJ) unit whose resistance can be adjusted to represent a logic state "0" or "1".

Conventionally, the magnetic tunnel junction (MTJ) unit is comprised of a fixed magnetic layer, a free magnetic layer, and a tunnel layer disposed there between. The resistance of the magnetic tunnel junction (MTJ) unit can be adjusted by changing a direction of a magnetic moment of the free magnetic layer with respect to that of the fixed magnetic layer. When the magnetic moment of the free magnetic layer is parallel to that of the fixed magnetic layer, the resistance of the magnetic tunnel junction (MTJ) unit is low, whereas when the magnetic moment of the free magnetic layer is anti-parallel to that of the fixed magnetic layer, the resistance of the magnetic tunnel junction (MTJ) unit is high. The magnetic tunnel junction (MTJ) unit is coupled between top and bottom electrodes, and an electric current flowing through the magnetic tunnel junction (MTJ) from one electrode to another can be detected to determine the resistance, and therefore the logic state of the magnetic tunnel junction (MTJ).

SUMMARY OF THE INVENTION

The present invention provides a method of manufacturing magnetic tunnel junction (MTJ) device, which forms a free layer having a spacer sandwiched by ferromagnetic layers, wherein the spacer and these ferromagnetic layers include oxidized sidewall parts. Therefore, stray field is reduced and device reliability is improved.

The present invention provides a method of manufacturing a magnetic tunnel junction (MTJ) device including the following steps. A substrate is provided. A bottom electrode layer, a blanket reference layer, a blanket tunnel barrier layer, a blanket first ferromagnetic layer, a spacer layer, a blanket second ferromagnetic layer and a top electrode layer are sequentially formed on the substrate. The top electrode layer, the blanket second ferromagnetic layer, the spacer layer, the blanket first ferromagnetic layer, the blanket tunnel barrier layer, the blanket reference layer and the bottom electrode layer are patterned to form a bottom electrode, a reference layer, a tunnel barrier layer, a free layer, which is composed by a first ferromagnetic layer, a spacer, a second ferromagnetic layer, and a top electrode on the substrate. A selective oxidation process is performed to only oxidize the first ferromagnetic layer, the spacer and the Second ferromagnetic layer, to form oxidized spacer sidewall parts of the spacer, first oxidized sidewall parts of the first ferromagnetic layer, and second oxidized sidewall parts of the second ferromagnetic layer.

According to the above, the present invention provides a method of manufacturing magnetic tunnel junction (MTJ) device, which forms a free layer having a spacer sandwiched by a first ferromagnetic layer and a second ferromagnetic layer, wherein the spacer includes oxidized spacer sidewall parts, the first ferromagnetic layer includes first oxidized sidewall parts, and the second ferromagnetic layer includes second oxidized sidewall parts. Therefore, the magnetic part of the magnetic tunnel junction (MTJ) device has a step shape, which has lower stray field, stable magnetic field, and improved device reliability.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
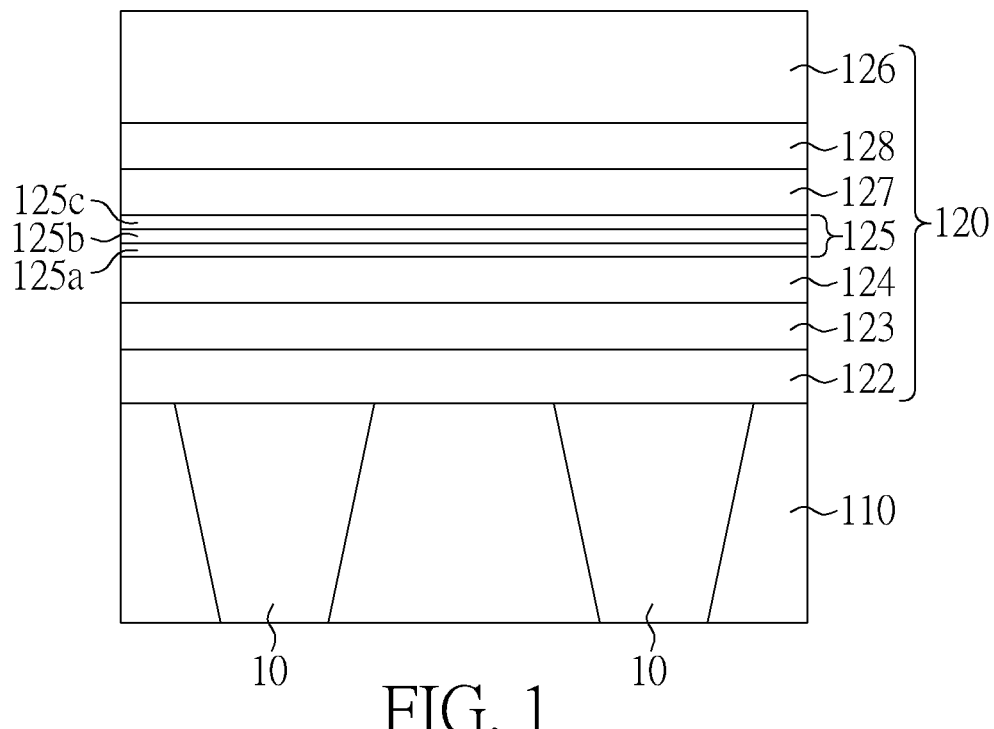
FIG. 1 schematically depicts a cross-sectional view of a method of manufacturing a magnetic tunnel junction (MTJ) device according to an embodiment of the present invention.

FIGS. 1-5 schematically depict cross-sectional views of a method of manufacturing a magnetic tunnel junction (MTJ) device according to an embodiment of the present invention. As shown in FIG. 1, a dielectric layer 110 and contact plugs 10 therein are disposed on a substrate (not shown), a cap layer (not shown), a dielectric layer (not shown), or a stacked structure etc. The dielectric layer 110 may be an oxide layer, and each of the contact plugs 10 may include a metal plug surrounded by a barrier layer, wherein the metal may include tungsten while the barrier layer may include titanium nitride or tantalum nitride, depending upon practical requirements. Then, a magnetic tunnel junction layer 120 is formed to blanketly cover the dielectric layer 110 and the contact plugs 10, wherein the magnetic tunnel junction layer 120 may include a bottom electrode 122, a reference layer 123, a tunnel barrier layer 124, a free layer 125 and a top electrode 126 stacked from bottom to top. The bottom electrode 122 and the top electrode 126 may include a conductive material, such as, for example, titanium nitride, tantalum nitride, titanium, tantalum, or a combination of one or more of the foregoing; the reference layer 123 may include CoFeB alloys, CoFe based alloys, Heusler alloys or combinations, the tunnel barrier layer 124 may include magnesium oxide. In the present invention, the free layer 125 includes a first ferromagnetic layer 125a, a spacer 125b and a second ferromagnetic layer 125c. The spacer 125b is sandwiched by the first ferromagnetic layer 125a and the second ferromagnetic layer 125c. The first ferromagnetic layer 125a and the second ferromagnetic layer 125c may include CoFeB layers, and the spacer may include Ta, Hf, Zr, V, W, Cr or Mn, but it is not limited thereto. Furthermore, a barrier cap layer 127 and a metal cap layer 128 may be optionally and sequentially formed on the free layer 125 while the magnetic tunnel junction layer 120 is formed. Preferably, the barrier cap layer 127 may be a magnesium oxide layer, and the metal cap layer 128 may include tantalum (Ta), tungsten (W), ruthenium (Ru) and above combinations, but it is not limited thereto.

Figure 2:
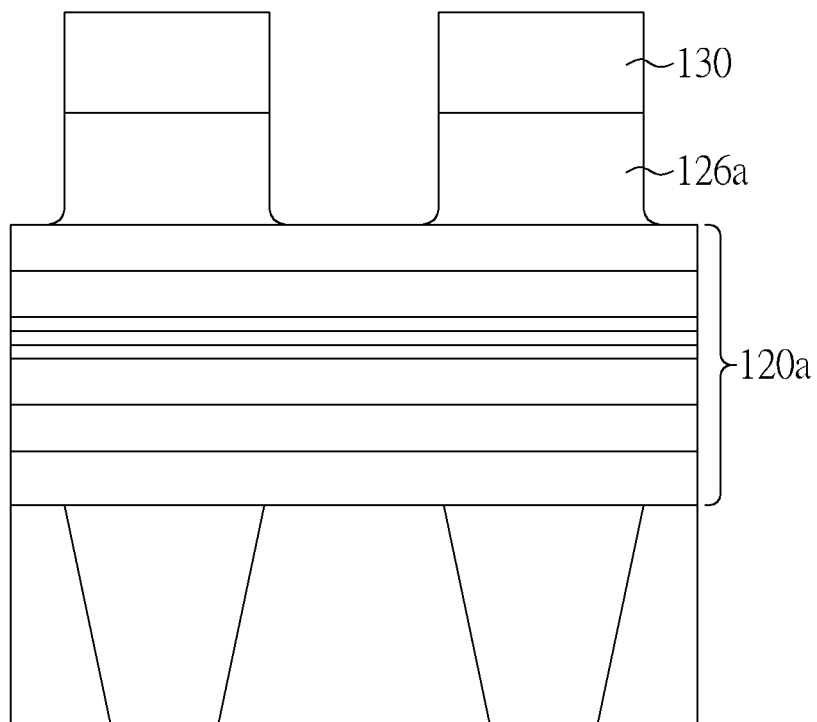
FIG. 2 schematically depicts a cross-sectional view of a method of manufacturing a magnetic tunnel junction (MTJ) device according to an embodiment of the present invention.
Figure 3:
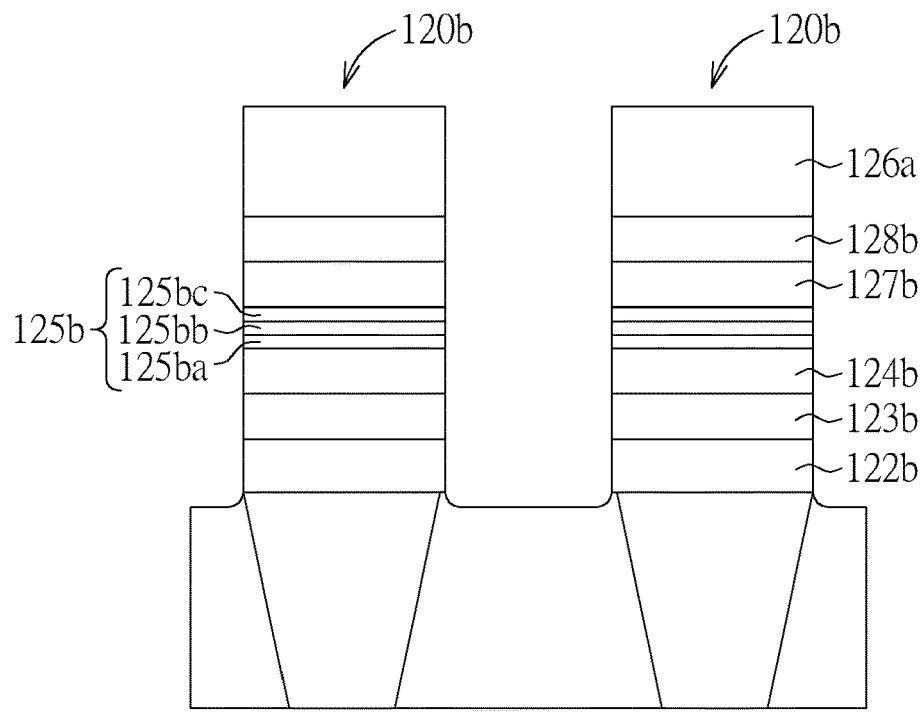
FIG. 3 schematically depicts a cross-sectional view of a method of manufacturing a magnetic tunnel junction (MTJ) device according to an embodiment of the present invention.

Then, the magnetic tunnel junction layer 120 is patterned to form magnetic tunnel junction elements 120b, as shown in FIGS. 2-3. As shown in FIGS. 1-2, a hard mask layer (not shown) may cover the top electrode 126, and the top electrode 126 may be patterned to form a top electrode 126a by patterning the hard mask layer (not shown) to form a hard mask 130, and then transferring the pattern of the hard mask 130 to the top electrode 126.

Thereafter, the remaining magnetic tunnel junction layer 120a is patterned by transferring the patterns of the top electrode 126a and the hard mask 130, and therefore the magnetic tunnel junction elements 120b are formed, as shown in FIG. 3. Each of the magnetic tunnel junction elements 120b includes a bottom electrode 122b, a reference layer 123b, a tunnel barrier layer 124b, a free layer 125b, a barrier cap layer 127b, a metal cap layer 128b and the top electrode 126a stacked from bottom to top, wherein the free layer 125b is composed by a first ferromagnetic layer 125ba, a spacer 125bb and a second ferromagnetic layer 125bc, as shown in FIG. 3.

Figure 4:
FIG. 4 schematically depicts a cross-sectional view of a method of manufacturing a magnetic tunnel junction (MTJ) device according to an embodiment of the present invention.
Figure 4:
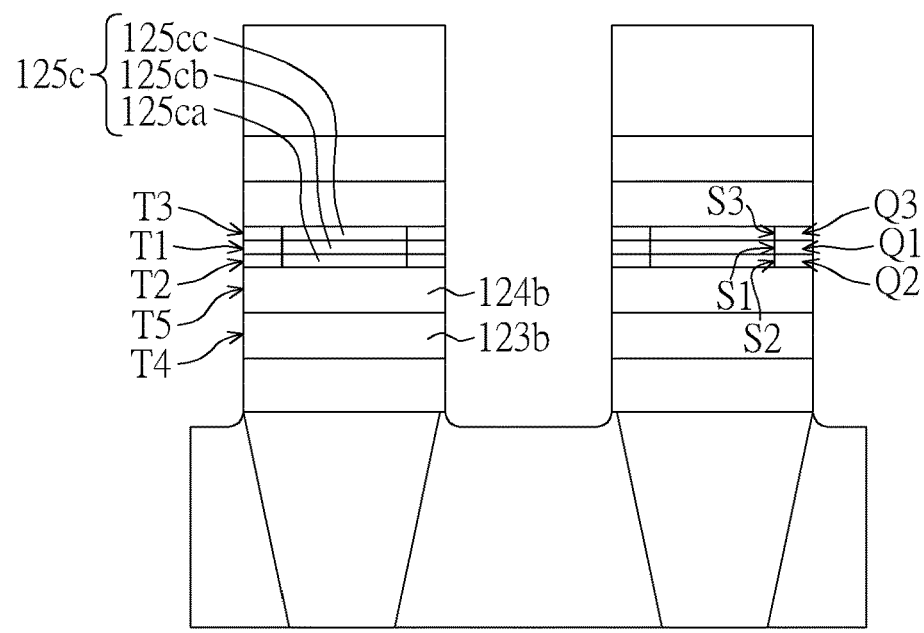

As shown in FIG. 4, a selective oxidation process P is performed to only oxidize the first ferromagnetic layer 125ba, the spacer 125bb and the second ferromagnetic layer 125bc, to form a free layer 125c including oxidized spacer sidewall parts Q1 of a spacer 125cb, first oxidized sidewall parts Q2 of a first ferromagnetic layer 125ca, and second oxidized sidewall parts Q3 of a second ferromagnetic layer 125cc. The first oxidized sidewall parts Q2 and the second oxidized sidewall parts Q3 include CoFeB oxide layers disposed on two opposite sidewalls S2 of the first ferromagnetic layer 125ca and two opposite sidewalls S3 of the second ferromagnetic layer 125cc respectively. The oxidized spacer sidewall parts Q1 are disposed on two opposite sidewalls S1 of the spacer 125cb. Hence, stray field is low, the magnetic field induced by the reference layer 123b and the free layer 125c is stable, and therefore the reliability of a formed device is improved.

Preferably, the selective oxidation process P is a high pressure process, and the pressure is preferably 1-20 torrs, to control the oxidizing rates by adjusting the ratio of oxidizing gas and inert gas imported during the selective oxidation process P is performed. Still preferably, $N_2O$ or $O_2$ is imported for serving as oxidation agent during the selective oxidation process P is performed to oxidize the first ferromagnetic layer 125ba, the spacer 125bb and the second ferromagnetic layer 125bc, wherein $N_2O$ or $O_2$ is easily absorbed at interfaces of the first ferromagnetic layer 125ba, the spacer 125bb and the second ferromagnetic layer 125bc such as interfaces of CoFeB/MgO; inert gas is imported during the selective oxidation process P is performed to dilute oxidant agent for controlling flow field in order to preventing over-oxidation. Preferably, Ar, Kr, Xe, $N_2$ or He is imported during the selective oxidation process P is performed.

Figure 6:
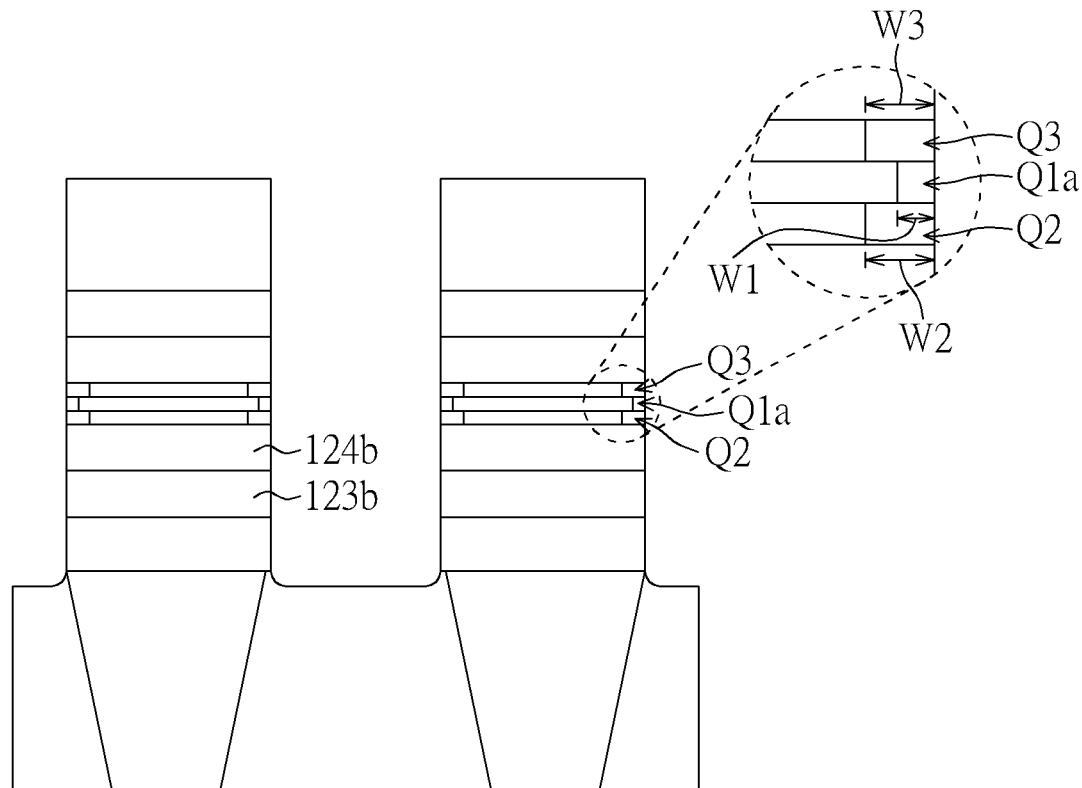
FIG. 6 schematically depicts a cross-sectional view of a magnetic tunnel junction (MTJ) device according to an embodiment of the present invention.
Figure 7:
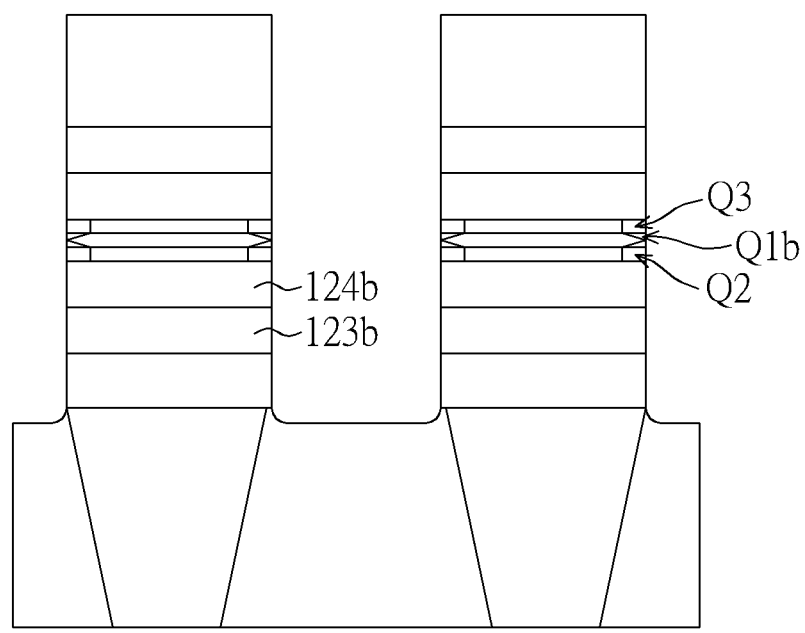
FIG. 7 schematically depicts a cross-sectional view of a magnetic tunnel junction (MTJ) device according to an embodiment of the present invention.

By applying the present invention, due to the oxidized spacer sidewall parts Q1 being formed by oxidation, sidewalls T1 of the spacer 125cb, sidewalls T2 of the first ferromagnetic layer 125ca and sidewalls T3 of the second ferromagnetic layers 125cc are trimmed with sidewalls T4 of the reference layer 123b and sidewalls T5 of the tunnel barrier layer 124b. Preferably, the oxidized spacer sidewall parts Q1 are 1%~20% of the spacer 125cb. Still preferably, the oxidized spacer sidewall parts Q1 are 5% of the spacer 125cb to optimize the purpose of the present invention. As the oxidized spacer sidewall parts Q1 are larger than 20%, resistance may too high. In this case, sidewalls S1 of the oxidized spacer sidewall parts Q1 are trimmed (aligned) with sidewalls S2 of the first oxidized sidewall parts Q2 and sidewalls S3 of the second oxidized sidewall parts Q3, but the present invention is not restricted thereto. In another case, as shown in FIG. 6, widths W1 of the oxidized spacer sidewall parts Q1a are thinner than widths W2 of the first oxidized sidewall parts Q2 and widths W3 of the second oxidized sidewall parts Q3. In another case, as shown in FIG. 7, the oxidized spacer sidewall parts Q1b have indent sharp corners. The three structures can be carried out by choosing oxidation agent during the selective oxidation process P, and the using of these structures depends upon practical requirements.

Figure 5:
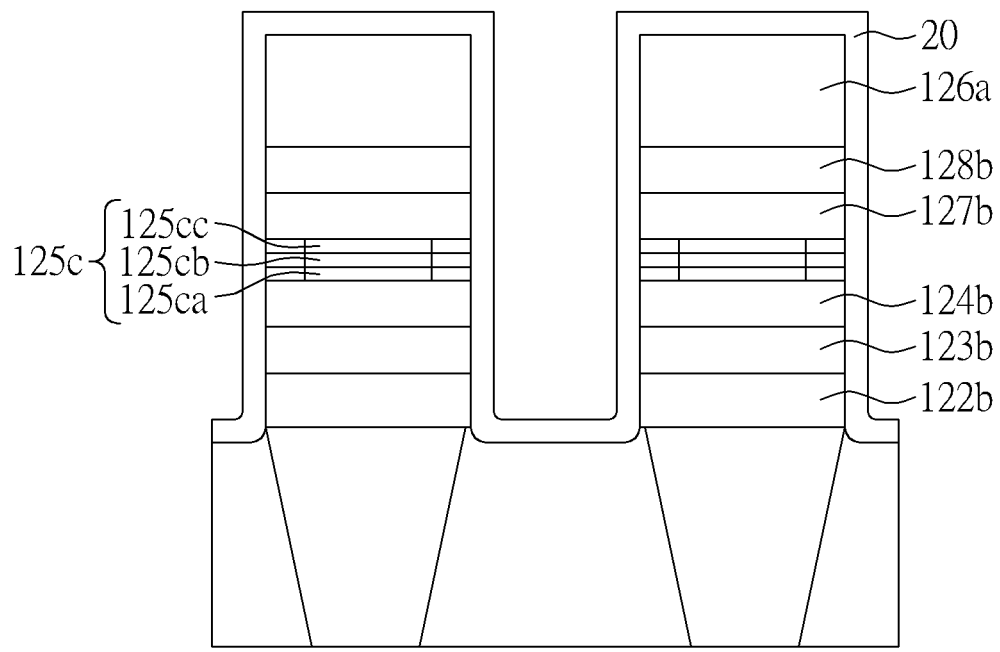
FIG. 5 schematically depicts a cross-sectional view of a method of manufacturing a magnetic tunnel junction (MTJ) device according to an embodiment of the present invention.

As shown in FIG. 5, a dielectric cap layer 20 may be optionally deposited to conformal cover the bottom electrode 122b, the reference layer 123b, the tunnel barrier layer 124b, the first ferromagnetic layer 125ca, the spacer 125cb, the second ferromagnetic layer 125cc, the barrier cap layer 127b, the metal cap layer 128b and the top electrode 126a. The dielectric cap layer 20 may include silicon nitride (SiN), silicon carbide nitride (SiCN), or aluminum nitride (AlN) etc.

Figure 8:
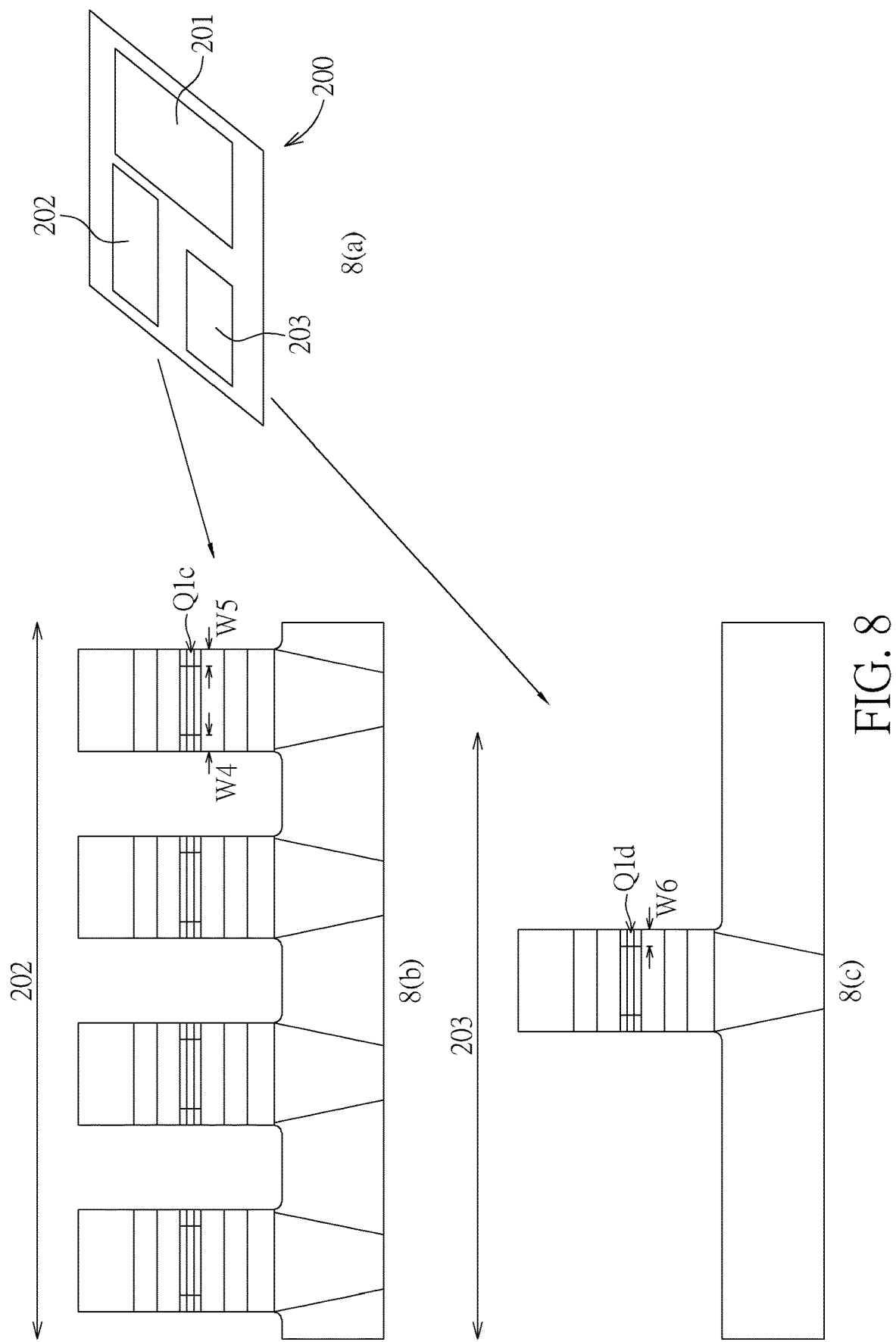
FIG. 8 schematically depicts a top view and cross-sectional views of an integrated circuit layout including magnetic tunnel junction (MTJ) devices according to an embodiment of the present invention.

FIG. 8 schematically depicts a top view and cross-sectional views of an integrated circuit layout including magnetic tunnel junction (MTJ) devices according to an embodiment of the present invention. As shown in FIG. 8(a), an integrated circuit layout 200 may include a logic area 201, a dense area 202 and an isolated area 203. FIG. 8(b) depicts a part of the dense area 202 and FIG. 8(c) depicts a part of the isolated area 203. As a selective oxidation process being a high pressure soaking process is performed, widths W4 of inner sides of the oxidized spacer sidewall parts Q1c in the dense area 202, widths W5 of external sides of the oxidized spacer sidewall parts Q1c in the dense area 202, and widths W6 of the oxidized spacer sidewall parts Q1d in the isolated area 203 are similar.

Figure 9:
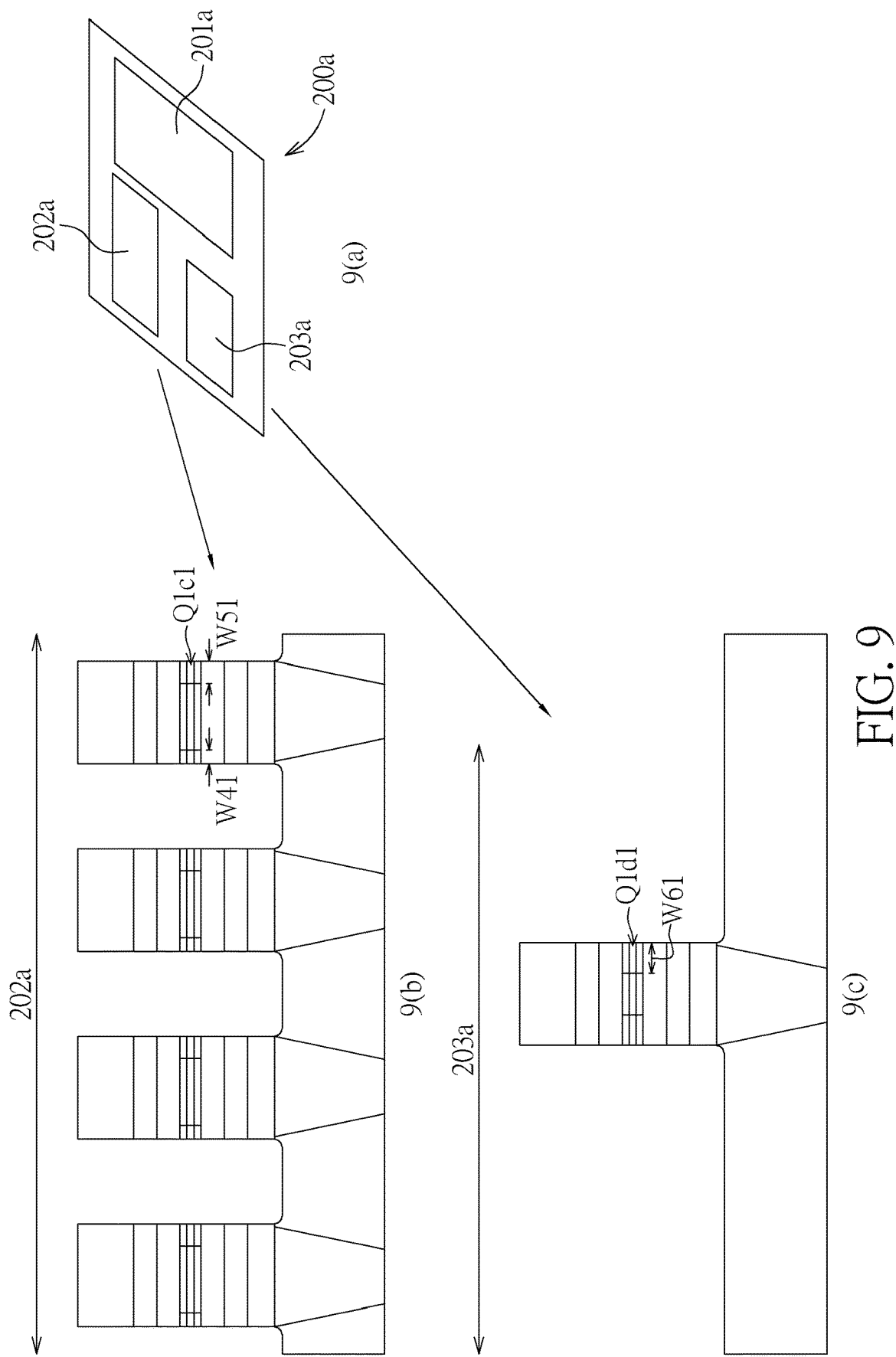
FIG. 9 schematically depicts a top view and cross-sectional views of an integrated circuit layout including magnetic tunnel junction (MTJ) devices according to an embodiment of the present invention.

FIG. 9 schematically depicts a top view and cross-sectional views of an integrated circuit layout including magnetic tunnel junction (MTJ) devices according to an embodiment of the present invention. As shown in FIG. 9(a), an integrated circuit layout 200a may include a logic area 201a, a dense area 202a and an isolated area 203a. FIG. 9(b) depicts a part of the dense area 202a and FIG. 9(c) depicts a part of the isolated area 203a. As a selective oxidation process being a low pressure soaking process is performed, widths W41 of inner sides of the oxidized spacer sidewall parts Q1c1 in the dense area 202a are less than or equal to widths W51 of external sides of the oxidized spacer sidewall parts Q1c1 in the dense area 202a, and widths W41 of inner sides of the oxidized spacer sidewall parts Q1c1 in the dense area 202a are less than or equal to widths W61 of the oxidized spacer sidewall parts Q1d1 in the isolated area 203a. And, widths W51 of external sides of the oxidized spacer sidewall parts Q1c1 in the dense area 202a are less than widths W61 of the oxidized spacer sidewall parts Q1d1 in the isolated area 203a.

To summarize, the present invention provides a magnetic tunnel junction (MTJ) device and manufacturing method thereof, which forms a free layer having a spacer sandwiched by a first ferromagnetic layer and a second ferromagnetic layer, wherein the spacer includes oxidized spacer sidewall parts, the first ferromagnetic layer includes first oxidized sidewall parts, and the second ferromagnetic layer includes second oxidized sidewall parts. Therefore, the magnetic part of the magnetic tunnel junction (MTJ) device has a step shape, which has lower stray field, stable magnetic field, and improved device reliability.

Moreover, the oxidized spacer sidewall parts are preferably 1%~20% of the spacer, and are still preferably 5% of the spacer to optimize said purpose of the present invention. Sidewalls of the oxidized spacer sidewall parts are trimmed with sidewalls of the first oxidized sidewall parts and sidewalls of the second oxidized sidewall parts; or, widths of the oxidized spacer sidewall parts are thinner than widths of the first oxidized sidewall parts and widths of the second oxidized sidewall parts; or, the oxidized spacer sidewall parts have indent sharp corners, depend upon practical requirements.

Furthermore, the magnetic tunnel junction (MTJ) device may be formed by performing a selective oxidation process to only oxidize the first ferromagnetic layer, the spacer and the second ferromagnetic layer, to form oxidized spacer sidewall parts of the spacer, first oxidized sidewall parts of the first ferromagnetic layer, and second oxidized sidewall parts of the second ferromagnetic layer. The selective oxidation process is preferably a high pressure process, and the pressure is 1-20 torrs for controlling oxidizing. Still preferably, $N_2O$ or $O_2$ is imported during the selective oxidation process for serving as oxidant agent and inert gas is imported during the selective oxidation process for diluting the oxidant agent, thereby preventing the spacer and ferromagnetic layers from over-oxidation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a magnetic tunnel junction (MTJ) device, comprising:
    providing a substrate;
    sequentially forming a bottom electrode layer, a blanket reference layer, a blanket tunnel barrier layer, a blanket first ferromagnetic layer, a spacer layer, a blanket second ferromagnetic layer and a top electrode layer on the substrate;
    patterning the top electrode layer, the blanket second ferromagnetic layer, the spacer layer, the blanket first ferromagnetic layer, the blanket tunnel barrier layer, the blanket reference layer and the bottom electrode layer to form a bottom electrode, a reference layer, a tunnel barrier layer, a free layer, which is composed by a first ferromagnetic layer, a spacer and a second ferromagnetic layer, and a top electrode on the substrate; and
    performing a selective oxidation process to only oxidize the first ferromagnetic layer, the spacer and the second ferromagnetic layer, to form oxidized spacer sidewall parts of the spacer, first oxidized sidewall parts of the first ferromagnetic layer, and second oxidized sidewall parts of the second ferromagnetic layer, wherein outer sidewalls of the first oxidized sidewall parts, the oxidized spacer sidewall parts and the second oxidized sidewall parts are parallel to a height direction of the MTJ device.

2. The method of manufacturing a magnetic tunnel junction (MTJ) device according to claim 1, wherein the selective oxidation process is a high pressure process, and the pressure is 1-20 tons.

3. The method of manufacturing a magnetic tunnel junction (MTJ) device according to claim 1, wherein $N_2O$ or $O_2$ is imported during the selective oxidation process is performed.

4. The method of manufacturing a magnetic tunnel junction (MTJ) device according to claim 1, wherein inert gas is imported during the selective oxidation process is performed.

5. The method of manufacturing a magnetic tunnel junction (MTJ) device according to claim 4, wherein Ar, Kr, Xe, $N_2$ or He is imported during the selective oxidation process is performed.

6. The method of manufacturing a magnetic tunnel junction (MTJ) device according to claim 1, further comprising:
    depositing a dielectric cap layer conformal covering the bottom electrode, the reference layer, the tunnel barrier layer, the first ferromagnetic layer, the spacer, the second ferromagnetic layer and the top electrode after the selective oxidation process is performed.

7. The method of manufacturing a magnetic tunnel junction (MTJ) device according to claim 1, further comprising:
    forming a barrier cap layer on the blanket second ferromagnetic layer before the top electrode layer is formed; and
    patterning the barrier cap layer.

8. The method of manufacturing a magnetic tunnel junction (MTJ) device according to claim 7, wherein the barrier cap layer comprises a magnesium oxide (MgO) layer.

9. The method of manufacturing a magnetic tunnel junction (MTJ) device according to claim 7, further comprising:
    forming a metal cap layer on the barrier cap layer before the top electrode layer is formed; and
    patterning the metal cap layer.

10. The method of manufacturing a magnetic tunnel junction (MTJ) device according to claim 9, wherein the metal cap layer comprises tantalum (Ta), tungsten (W), ruthenium (Ru) and above combinations.

11. The method of manufacturing a magnetic tunnel junction (MTJ) device according to claim 1, wherein the first ferromagnetic layer and the second ferromagnetic layer comprise CoFeB layers.

12. The method of manufacturing a magnetic tunnel junction (MTJ) device according to claim 1, wherein the first oxidized sidewall parts and the second oxidized sidewall parts comprise CoFeB oxide layers disposed on two opposite sidewalls of the first ferromagnetic layer and two opposite sidewalls of the second ferromagnetic layer respectively.

13. The method of manufacturing a magnetic tunnel junction (MTJ) device according to claim 1, wherein the spacer comprises Ta, Hf, Zr, V, W, Cr or Mn.

14. The method of manufacturing a magnetic tunnel junction (MTJ) device according to claim 1, wherein the oxidized spacer sidewall parts are 1%-20% of the spacer.

15. The method of manufacturing a magnetic tunnel junction (MTJ) device according to claim 14, wherein the oxidized spacer sidewall parts are 5% of the spacer.

16. The method of manufacturing a magnetic tunnel junction (MTJ) device according to claim 1, wherein inner sidewalls of the oxidized spacer sidewall parts are trimmed with inner sidewalls of the first oxidized sidewall parts and inner sidewalls of the second oxidized sidewall parts.

17. The method of manufacturing a magnetic tunnel junction (MTJ) device according to claim 1, wherein widths of the oxidized spacer sidewall parts are thinner than widths of the first oxidized sidewall parts and widths of the second oxidized sidewall parts.

18. The method of manufacturing a magnetic tunnel junction (MTJ) device according to claim 1, wherein the oxidized spacer sidewall parts have indent sharp corners.

19. The method of manufacturing a magnetic tunnel junction (MTJ) device according to claim 17, wherein sidewalls of the spacer and the first and second ferromagnetic layers are trimmed with sidewalls of the reference layer and the tunnel barrier layer.

\* \* \* \* \*